United States Patent
Lin et al.

(10) Patent No.: US 7,091,786 B2
(45) Date of Patent: *Aug. 15, 2006

(54) LINEAR-IN-DECIBEL VARIABLE GAIN AMPLIFIER

(75) Inventors: Ying-Yao Lin, I-Lan Hsien (TW); Tung-Ming Su, Kao-Hsiung Hsien (TW)

(73) Assignee: Realtek Semiconductor Corp., HsinChu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 10/708,202

(22) Filed: Feb. 16, 2004

(65) Prior Publication Data

US 2005/0017807 A1  Jan. 27, 2005

(30) Foreign Application Priority Data

Jul. 21, 2003 (TW) ............... 92119874 A

(51) Int. Cl.
*H03F 3/45* (2006.01)
(52) U.S. Cl. ...................... 330/254; 330/256
(58) Field of Classification Search ............... 330/254, 330/256, 260, 250
See application file for complete search history.

(56) References Cited

U.S. PATENT DOCUMENTS

| | | | |
|---|---|---|---|
| 5,030,924 A | 7/1991 | Fritz | |
| 5,162,678 A * | 11/1992 | Yamasaki | 327/331 |
| 5,247,398 A | 9/1993 | Sidman | |
| 5,572,166 A | 11/1996 | Gilbert | |
| 5,684,431 A | 11/1997 | Gilbert et al. | |
| 5,900,781 A | 5/1999 | Igarashi et al. | |
| 5,912,589 A | 6/1999 | Khoury et al. | |
| 6,020,786 A | 2/2000 | Ashby | |
| 6,124,761 A | 9/2000 | Robinson et al. | |
| 6,292,059 B1 | 9/2001 | Ao et al. | |
| 6,509,798 B1 | 1/2003 | Kuroda | |
| 6,525,606 B1 | 2/2003 | Atkinson | |
| 6,661,286 B1 * | 12/2003 | Filoramo et al. | 330/254 |
| 6,724,235 B1 | 4/2004 | Costa et al. | |
| 6,771,111 B1 * | 8/2004 | Sheng et al. | 327/346 |
| 6,777,999 B1 * | 8/2004 | Kanou et al. | 327/346 |
| 6,791,413 B1 | 9/2004 | Komurasaki et al. | |
| 6,819,183 B1 | 11/2004 | Zhou et al. | |
| 6,882,185 B1 | 4/2005 | Walker et al. | |
| 6,894,564 B1 | 5/2005 | Gilbert | |
| 6,930,532 B1 * | 8/2005 | Kanou et al. | 327/346 |
| 2001/0006353 A1 | 7/2001 | Setty | |
| 2003/0058047 A1 | 3/2003 | Sakumi | |
| 2003/0107438 A1 | 6/2003 | Kimura | |
| 2003/0132795 A1 * | 7/2003 | Sheng et al. | 327/346 |
| 2003/0169090 A1 | 9/2003 | Filoramo et al. | |
| 2004/0196088 A1 * | 10/2004 | Kanou et al. | 327/346 |
| 2005/0068087 A1 | 3/2005 | Kanou | |
| 2005/0184805 A1 | 8/2005 | Murakami | |
| 2005/0195035 A1 * | 9/2005 | Hu | 330/254 |

OTHER PUBLICATIONS

U.S. Appl. No. 10/709,198 filed Apr. 20, 2004.*

* cited by examiner

*Primary Examiner*—Linh Nguyen
(74) *Attorney, Agent, or Firm*—Winston Hsu

(57) ABSTRACT

A linear-in-decibel variable gain amplifier used for receiving an input voltage and generating an output voltage according to a first controlling voltage and a second controlling voltage. A voltage gain, that is, the ratio between the output voltage and the input voltage, has a denominator that is a pure exponential function, and the value of the pure exponential function is determined by the first controlling voltage and second controlling voltage.

26 Claims, 5 Drawing Sheets

LINEAR-IN-DECIBEL VARIABLE GAIN AMPLIFIER

BACKGROUND OF INVENTION

1. Field of the Invention

The invention relates to a variable gain amplifier, and more particularly, to a variable gain amplifier having a gain liner-in-decibel with respect to controlling voltages.

2. Description of the Prior Art

Recently wireless communication systems have been developing very fast. As a result, many kinds of high bandwidth high sensitivity transceivers are proposed. Variable gain amplifiers are often used in this kind of transceiver to broaden the processing range of the system. A variable gain amplifier that has a gain liner in decibel (dB) with respect to controlling voltage(s) has relatively broader gain range.

Please refer to FIG. 1 where a circuit of a conventional variable gain amplifier is illustrated. The variable gain amplifier shown in FIG. 1 is a differential amplifier. The voltage gain Av of the whole circuit can be determined from the half circuit of the differential amplifier. Disregarding the phase, the voltage gain Av of this variable gain amplifier will be:

$$Av = \frac{Vout'}{Vin'} = \frac{K}{1 + \exp\left(\frac{Vy}{Vt}\right)} \quad (1)$$

where K is substantially a constant value.

From equation (1) it can be seen that the denominator of the voltage gain Av comprises not only a simple exponential function but also a constant term 1. Consequently, the voltage gain Av does not have a perfectly exponential relationship with respect to the controlling voltage Vy.

Please refer to FIG. 2. FIG. 2 is a graph for showing the relation between the voltage gain Av and the controlling voltage Vy of FIG. 1. Note that when Vy<Vt, the voltage gain Av will not change exponentially with respect to the change in the controlling voltage Vy. The smaller the controlling voltage Vy is, the less the voltage gain Av will change with respect to the change in the controlling voltage Vy. This phenomenon where the voltage gain Av does not have perfect exponential relationship with the controlling voltage Vy is caused by the constant term 1.

SUMMARY OF INVENTION

It is therefore one of the many objectives of the claimed invention to provide a variable gain amplifier that can substantially demonstrate a simple linear-in-decibal relationship of a voltage gain with respect to controlling voltage(s).

According to the claimed invention, a variable gain amplifier is disclosed. The variable gain amplifier comprises an amplifying stage for generating an output voltage according to an input voltage; and a variable gain stage for adjusting a voltage gain of the amplifying stage according to at least a controlling voltage; wherein the voltage gain is a simple exponential function, and the value of the simple exponential function is determined by the controlling voltage.

These and other objectives of the present invention will no doubt become obvious to those of ordinary skill in the art after reading the following detailed description of the embodiments that is illustrated in the various figures and drawings.

DETAILED DESCRIPTION

Figure 3:
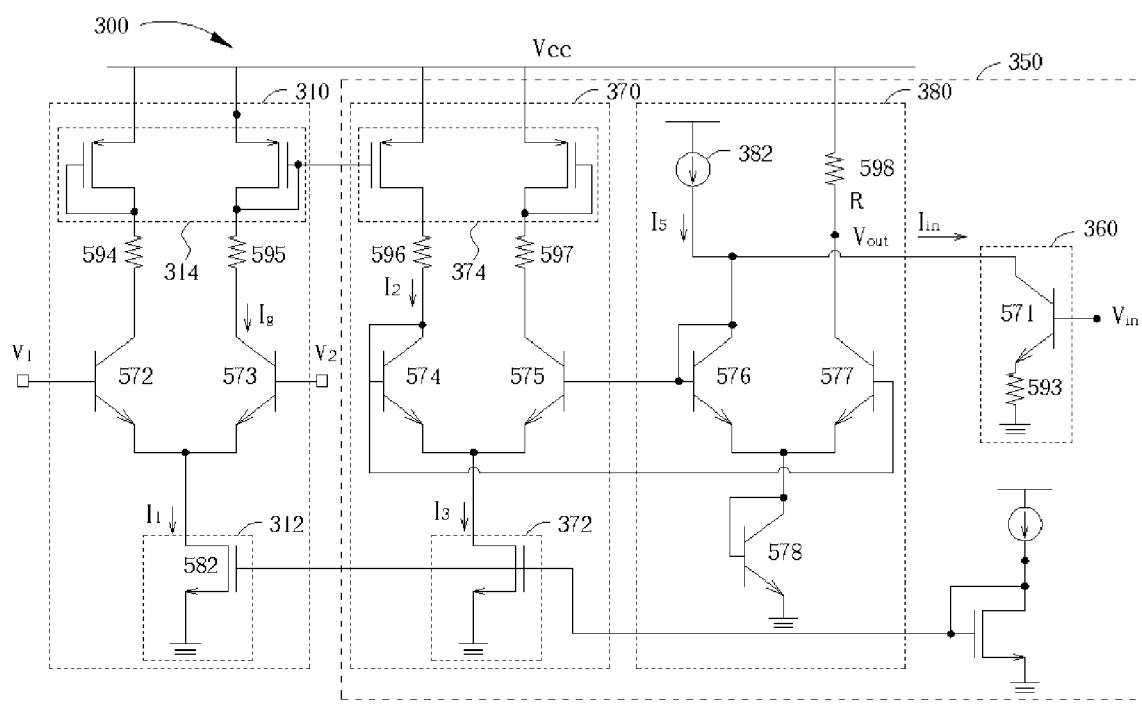
FIG. 3 is a circuit diagram of a variable gain amplifier according to an embodiment of the present invention.

Please refer to FIG. 3 where a first embodiment circuit diagram of a variable gain amplifier of the present invention is illustrated. As shown in FIG. 3, the variable gain amplifier 300 includes: an amplifying stage 350 for generating an output voltage Vout according to an input voltage Vin and a variable gain stage 310 for controlling the value of a voltage gain Av of the amplifying stage 350 according to a first controlling voltage V1 and a second controlling voltage V2, wherein the voltage gain Av is the ratio between the output voltage Vout and the input voltage Vin. The denominator of the voltage gain Av is a simple exponential function; the value of the simple exponential function is determined by the difference between the first controlling voltage V1 and the second controlling voltage V2.

The variable gain stage 310 is a transconductance amplifier for generating a gain current Ig according to the difference between the first controlling voltage V1 and the second controlling voltage V2. In this embodiment, the variable gain stage 310 includes: a first transistor 572 coupled to the first controlling voltage V1; a second transistor 573 coupled to the second controlling voltage V2; a first current source 312 coupled to the emitters of the first transistor 572 and the second transistor 573 to provide a first current I1; a second current source 314 for generating the gain current Ig; a first resistor 594 coupled between the collector of the first transistor 572 and the second current source 314; and a second resistor 595 coupled between the collector of the second transistor 573 and the second current source 314.

The value of the gain current Ig is determined by the difference between the first controlling voltage V1 and the second controlling voltage V2 and the value of the first current I1. In this embodiment, their relationship is as follows:

$$Ig = I1 \Big/ \left[1 + \exp\left(\frac{V1 - V2}{Vt}\right)\right] \quad (2)$$

As for the amplifying stage 350, it includes: an input unit 360 for receiving the input voltage Vin and generating an input current Iin according to the input voltage Vin; a current transforming unit 370 for generating a second current I2 according to the gain current Ig; and a transresistance amplifying unit 380 for generating the output voltage Vout wherein the value of the output voltage Vout is determined by the input current Iin and the second current I2.

In this embodiment, the input unit 360 includes an input transistor 571. The input transistor 571 is for generating an input current Iin according to the input voltage Vin. As for the current transforming unit 370, it includes: a third transistor 574, the collector and the base of which are coupled together; a fourth transistor 575; a third current source 372 coupled to the emitters of the third transistor 574 and the fourth transistor 575 to provide a third current I3; a fourth current source 374 for generating the second current I2; a third resistor 596 coupled between the collector of the third transistor 574 and the fourth current source 374; and a fourth resistor 597 coupled between the collector of the fourth transistor 575 and the fourth current source 374. Please note that the ratio between the third current I3 and first current I1 is substantially the same as the ratio between the second current I2 and the gain current Ig. In the embodiment circuit diagram shown in FIG. 3, if the parameters of the elements of FIG. 3 are properly designed, the above requirement can be satisfied.

As for the transresistance amplifying unit 380, in this embodiment it includes: a fifth transistor 576, the base and the collector of which are coupled to the base of the fourth transistor 575; a sixth transistor 577, the base of which is coupled to the base of the third transistor 574; a seventh transistor 578, the base and the collector of which are coupled to the emitters of the fifth transistor 576 and the sixth transistor 577; a fifth current source 382 coupled to the input unit 360 and the collector of the fifth transistor 576 to provide a fifth current I5; and an output resistor 598 coupled to the collector of the sixth transistor 577 to generate the output voltage Vout.

Consider the variable gain amplifier 300 as a whole, the function of which is to amplify the input voltage Vin to obtain the output voltage Vout. The ratio between the output voltage Vout and the input voltage Vin, that is the voltage gain Av, is as follows:

$$Av = \frac{Vout}{Vin} = \frac{K}{\exp\left(\frac{V1-V2}{Vt}\right)} \quad (3)$$

where K is substantially a constant value.

Figure 1:
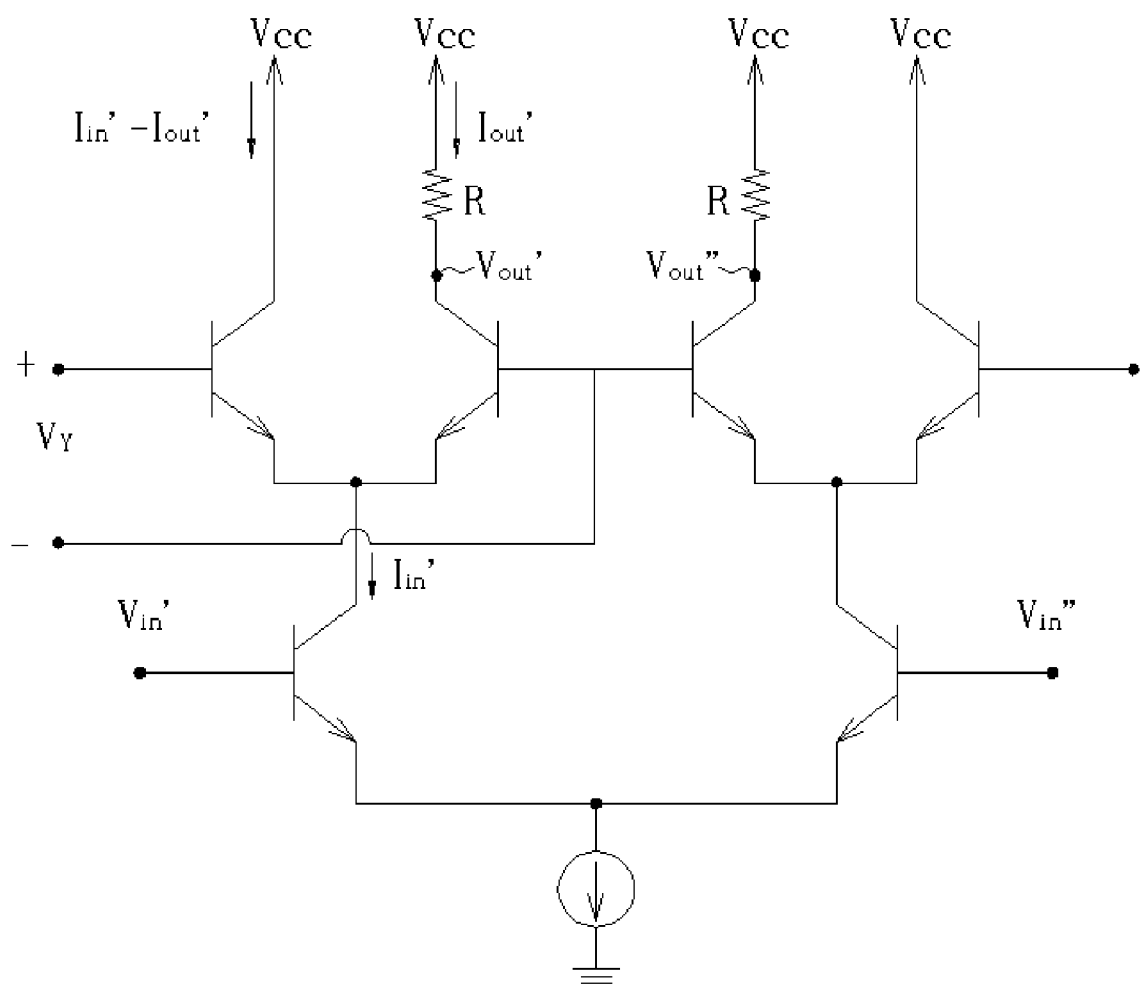
FIG. 1 is a circuit diagram of a conventional variable gain amplifier.
Figure 2:
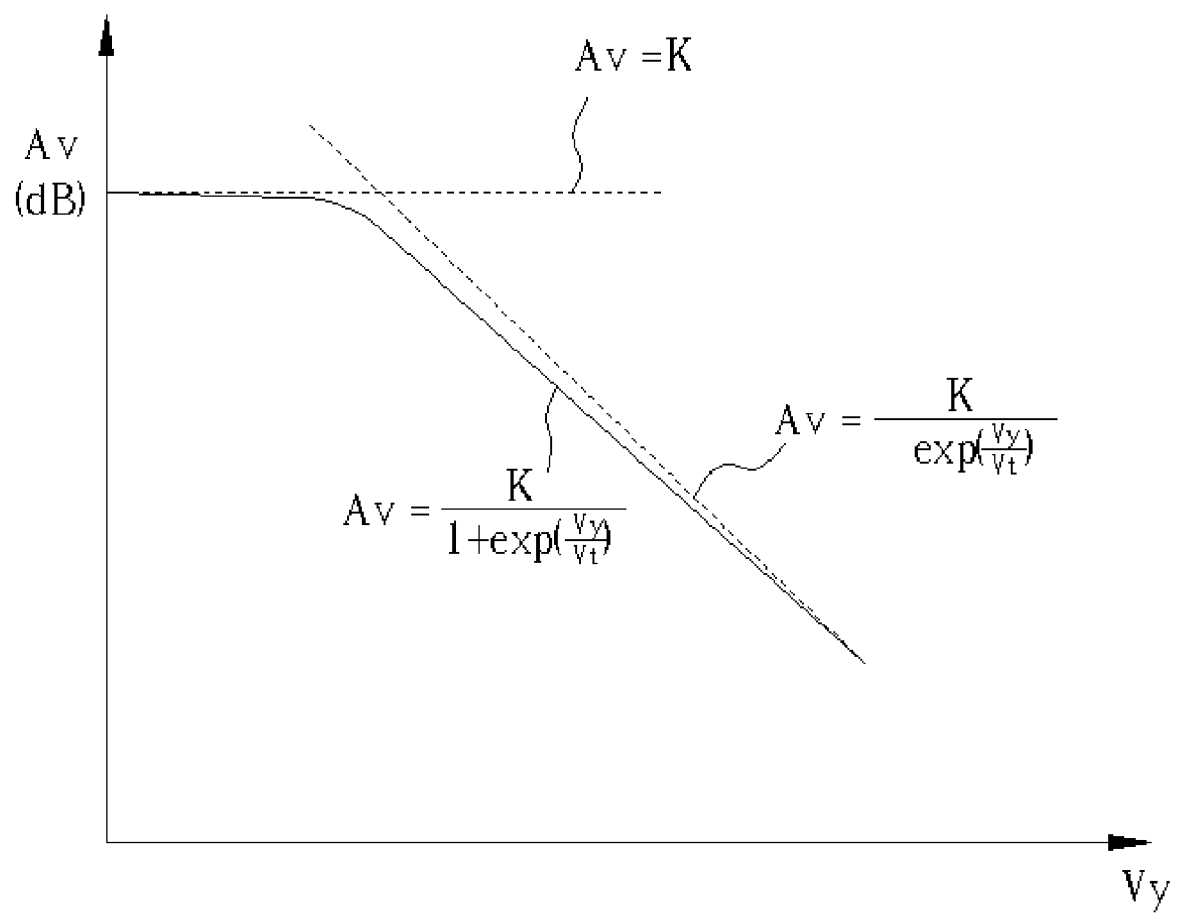
FIG. 2 is a graph for showing the relationship between the voltage gain Av and the controlling voltage Vy of FIG. 1.
Figure 4:
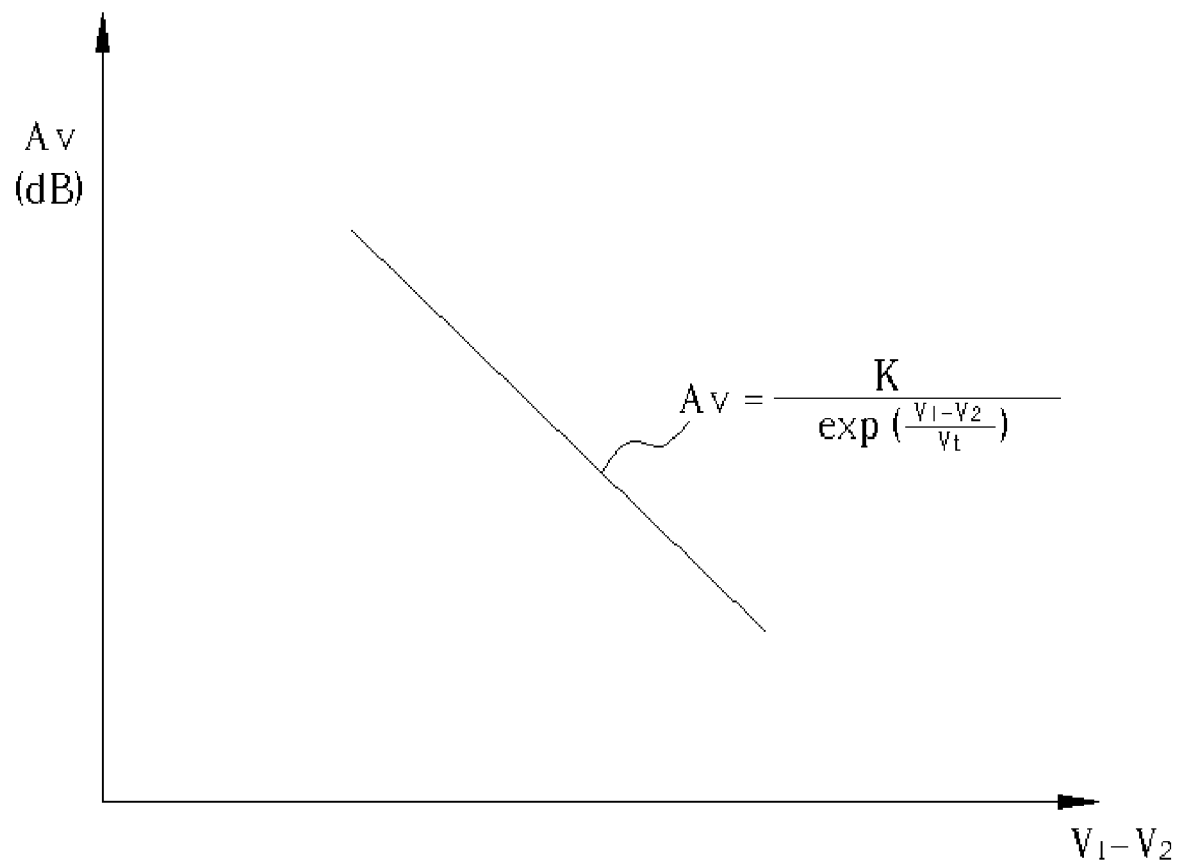
FIG. 4 is a graph for showing the relationship between the voltage gain Av and the difference between the controlling voltages of FIG. 3.

The term $$\exp\left(\frac{V1-V2}{Vt}\right)$$

of equation (3) is the simple exponential function mentioned above; the value of which is determined by the difference between the first controlling voltage V1 and the second controlling voltage V2. Please refer to FIG. 4. FIG. 4 is a graph for showing the relationship between the voltage gain Av and difference between the controlling voltages of FIG. 3. Compared with FIG. 2, it is obvious that in FIG. 4 the voltage gain Av has an authentic exponential relationship with the difference between the first controlling voltage V1 and the second controlling voltage V2.

Figure 5:
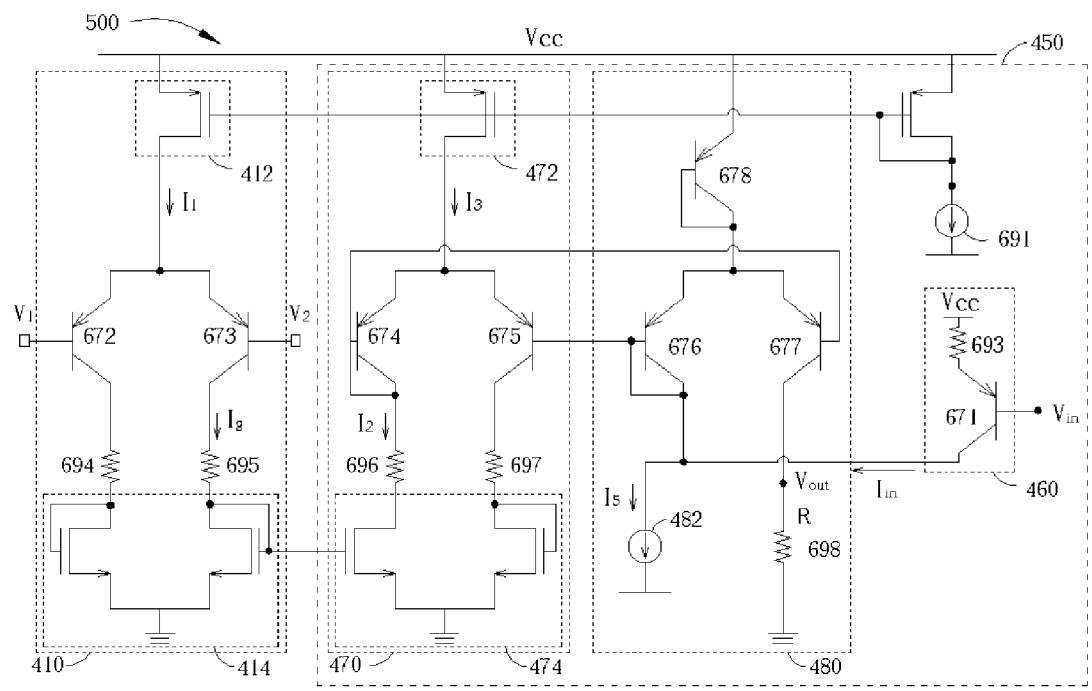
FIG. 5 is a circuit diagram of a variable gain amplifier according to another embodiment of the present invention.

Please refer to FIG. 5. FIG. 5 is a second embodiment circuit diagram of a variable gain amplifier of the present invention. The difference between FIG. 5 and FIG. 3 is that NMOS transistors in FIG. 3 are replaced by PMOS transistors in FIG. 5, PMOS transistors in FIG. 3 are replaced by NMOS transistors in FIG. 5, NPN type BJTs in FIG. 3 are replaced by PNP type BJTs in FIG. 5, and PNP type BJTs in FIG. 3 are replaced by NPN type BJTs in FIG. 5. However, the basic operating principle remains the same.

In actuality, the embodiments shown if FIG. 3 and FIG. 5 not only can be used alone for amplifying a voltage signal, but each of them can also be used as a half circuit of a differential amplifier.

Those skilled in the art will readily observe that numerous modification and alternation of the device may be made while retaining the teaching of the invention. Accordingly, the above disclosure should be construed as limited only by the metes and bounds of the appended claims.

The invention claimed is:

1. A variable gain amplifier, comprising:
   an amplifying stage for generating an output voltage according to an input voltage; and
   a variable gain stage coupled to the amplifying stage by using a current mirror structure for adjusting a voltage gain of the amplifying stage according to at least a controlling voltage;
   wherein the denominator of the voltage gain is a simple exponential function, the voltage gain is decreasing while the controlling voltage is increasing, and the controlling voltage is determined according to the subtraction between a first controlling voltage and a second controlling voltage.

2. The variable gain amplifier of claim 1, wherein the simple exponential function comprises a function which raises a base to the power of an argument, without an addition operation or a subtraction operation with a constant being performed on the function.

3. The variable gain amplifier of claim 1, wherein the value of the simple exponential function is determined by the difference between the first and the second controlling voltages.

4. The variable gain amplifier of claim 3, wherein the variable gain stage is a transconductance amplifier for generating a gain current according to the difference between the first and the second controlling voltages.

5. The variable gain amplifier of claim 4, wherein the variable gain stage comprises:
   a first transistor coupled to the first controlling voltage;
   a second transistor coupled to the second controlling voltage;
   a first current source coupled to the emitter of the first and the second transistors for providing a first current; and
   a second current source for generating the gain current, wherein the value of the gain current is determined by the first current and the difference between the first and the second controlling voltages.

6. The variable gain amplifier of claim 5, wherein the variable gain stage further comprises:
   a first resistor coupled between the collector of the first transistor and the second current source; and
   a second resistor coupled between the collector of the second transistor and the second current source.

7. The variable gain amplifier of claim 5, wherein the amplifying stage comprises:
   an input unit coupled to the input voltage for generating an input current according to the input voltage;
   a current transforming unit for generating a second current according to the gain current; and
   a transresistance amplifying unit for generating the output voltage, wherein the value of the output voltage is determined by the input current and the second current.

8. The variable gain amplifier of claim 7, wherein the input unit comprises an input transistor coupled to the input voltage for generating the input current according to the input voltage.

9. The variable gain amplifier of claim 7, wherein the current transforming unit comprises:
   a third transistor, the collector of the third transistor being coupled to the base of the third transistor;
   a fourth transistor;
   a third current source coupled to the emitter of the third and the fourth transistors for providing a third current; and
   a fourth current source for generating the second current;
   whereby the ratio between the third current and the first current is substantially equivalent to the ratio between the second current and the gain current.

10. The variable gain amplifier of claim 9, wherein the current transforming unit further comprises:
    a third resistor coupled between the collector of the third transistor and the fourth current source; and
    a fourth resistor coupled between the collector of the fourth transistor and the fourth current source.

11. The variable gain amplifier of claim 9, wherein the transresistance amplifying unit comprises:
    a fifth transistor, the base and the collector of the fifth transistor being coupled to the base of the fourth transistor;
    a sixth transistor, the base of the sixth transistor being coupled to the base of the third transistor;
    a seventh transistor, the base and the collector of the seventh transistor being coupled to the emitter of the fifth and the sixth transistors;
    a fifth current source coupled to the input unit and the collector of the fifth transistor for providing a fifth current; and
    an output resistor coupled to the collector of the sixth transistor for generating the output voltage.

12. The variable gain amplifier of claim 3, wherein the voltage gain is expressed as $C1/\exp(C2(V1-V2)/Vt)$, wherein both C1 and C2 are constant values, V1 is the first controlling voltage, Vt is the thermal voltage, and V2 is the second controlling voltage.

13. The variable gain amplifier of claim 1, wherein the variable gain amplifier is the half-circuit of a differential amplifier.

14. A variable gain amplifier, comprising:
    an amplifying stage for generating an output voltage according to an input voltage; and
    a variable gain stage coupled to the amplifying stage by using a current mirror structure for adjusting a voltage gain of the amplifying stage according to at least a controlling voltage;
    wherein the voltage gain increases linearly in decibel while the controlling voltage decreases and the controlling voltage is determined by the subtraction between a first controlling voltage and a second controlling voltage.

15. The variable gain amplifier of claim 14, wherein the voltage gain changes linearly in decibel with respect to a simple exponential function, and the value of the simple exponential function is determined by the controlling voltage.

16. The variable gain amplifier of claim 15, wherein the simple exponential function comprises a function which raises a base to the power of an argument, without an addition operation or a subtraction operation with a constant being performed on the function.

17. The variable gain amplifier of claim 14, wherein the voltage gain changes linearly in decibel according to the difference between the first and the second controlling voltages.

18. The variable gain amplifier of claim 17, wherein the variable gain stage is a transconductance amplifier for generating a gain current according to the difference between the first and the second controlling voltages.

19. The variable gain amplifier of claim 18, wherein the variable gain stage comprises:
    a first transistor coupled to the first controlling voltage;
    a second transistor coupled to the second controlling voltage;
    a first current source coupled to the emitter of the first and the second transistors for providing a first current; and
    a second current source for generating the gain current, wherein the value of the gain current is determined by the first current and the difference between the first and the second controlling voltages.

20. The variable gain amplifier of claim 19, wherein the variable gain stage further comprises:
    a first resistor coupled between the collector of the first transistor and the second current source; and
    a second resistor coupled between the collector of the second transistor and the second current source.

21. The variable gain amplifier of claim 18, wherein the amplifying stage comprises:
    an input unit coupled to the input voltage for generating an input current according to the input voltage;
    a current transforming unit for generating a second current according to the gain current; and
    a transresistance amplifying unit for generating the output voltage, wherein the value of the output voltage is determined by the input current and the second current.

22. The variable gain amplifier of claim 21, wherein the input unit comprises an input transistor coupled to the input voltage for generating the input current according to the input voltage.

23. The variable gain amplifier of claim 21, wherein the current transforming unit comprises:
    a third transistor, the collector of the third transistor being coupled to the base of the third transistor;
    a fourth transistor;
    a third current source coupled to the emitter of the third and the fourth transistors for providing a third current; and
    a fourth current source for generating the second current;
    whereby the ratio between the third current and the first current is substantially equivalent to the ratio between the second current and the gain current.

24. The variable gain amplifier of claim 23, wherein the current transforming unit further comprises:
    a third resistor coupled between the collector of the third transistor and the fourth current source; and
    a fourth resistor coupled between the collector of the fourth transistor and the fourth current source.

25. The variable gain amplifier of claim 23, wherein the transresistance amplifying unit comprises:
    a fifth transistor, the base and the collector of the fifth transistor being coupled to the base of the fourth transistor;
    a sixth transistor, the base of the sixth transistor being coupled to the base of the third transistor;

a seventh transistor, the base and the collector of the seventh transistor being coupled to the emitter of the fifth and the sixth transistors;

a fifth current source coupled to the input unit and the collector of the fifth transistor for providing a fifth current; and an output resistor coupled to the collector of the sixth transistor for generating the output voltage.

26. The variable gain amplifier of claim 17, wherein the voltage gain is expressed as C1/exp(C2(V1−V2)/Vt), wherein both C1 and C2 are constant values, V1 is the first controlling voltage, Vt is the thermal voltage, and V2 is the second controlling voltage.

\* \* \* \* \*